(12) United States Patent
Seward

(10) Patent No.: US 10,201,070 B2
(45) Date of Patent: Feb. 5, 2019

(54) SYSTEMS AND METHODS FOR GENERATING ELECTRON SPIRAL TOROIDS

(71) Applicant: Electron Power Systems, Inc., Belvedere, CA (US)

(72) Inventor: Clint Seward, Acton, MA (US)

(73) Assignee: Electron Power Systems, Inc., Acton, MA (US)

(*) Notice: Subject to any disclaimer, the term of this patent is extended or adjusted under 35 U.S.C. 154(b) by 82 days.

(21) Appl. No.: 14/185,605

(22) Filed: Feb. 20, 2014

(65) Prior Publication Data

US 2014/0312770 A1    Oct. 23, 2014
US 2018/0235067 A9    Aug. 16, 2018

Related U.S. Application Data

(63) Continuation-in-part of application No. 13/737,519, filed on Jan. 9, 2013.
(Continued)

(51) Int. Cl.
  *H05H 1/04*    (2006.01)
  *H05H 1/48*    (2006.01)
  (Continued)

(52) U.S. Cl.
  CPC ............... *H05H 1/48* (2013.01); *G21B 1/05* (2013.01); *H05H 1/04* (2013.01); *H05H 1/12* (2013.01); *Y02E 30/126* (2013.01)

(58) Field of Classification Search
  None
  See application file for complete search history.

(56) References Cited

U.S. PATENT DOCUMENTS 3,767,922 A * 10/1973 Towlson ............... H05B 7/225
                                                         250/340
4,047,068 A *  9/1977 Ress ....................... G21B 1/00
                                                         313/161
(Continued)

FOREIGN PATENT DOCUMENTS

CA          925157 A       4/1973
WO       1996/38848 A1    12/1996

OTHER PUBLICATIONS

V. H Chaplin et al .Spectroscopic measurements of temperature and plasma impurity concentration during magnetic reconnection at the Swarthmore Spheromak experiment Published in Physics of Plasmas vol. 16 Apr. 9, 2009 p. 042505-1 to 042505-11.*
(Continued)

*Primary Examiner* — Douglas W Owens
*Assistant Examiner* — Srinivas Sathiraju
(74) *Attorney, Agent, or Firm* — McCarter & English, LLP; Thomas Hoover

(57) ABSTRACT

A spheromak is a plasma of ions and electrons formed into a toroidal shape. A spheromak plasma can include electrons and ions of nearly equal amounts such that it is essentially charge neutral. It contains large internal electrical currents and their associated internal magnetic fields arranged so that the forces within the spheromak are nearly balanced. The spheromak described herein is observed to form around an electric arc in partial atmosphere, and is observed to be self-stable with no external magnetic containment.

20 Claims, 13 Drawing Sheets

Related U.S. Application Data

(60) Provisional application No. 61/710,417, filed on Oct. 5, 2012.

(51) Int. Cl.
  *G21B 1/05* (2006.01)
  *H05H 1/12* (2006.01)

(56) References Cited

U.S. PATENT DOCUMENTS

| | | | | |
|---|---|---|---|---|
| 4,244,782 | A * | 1/1981 | Dow | G21B 1/05 376/139 |
| 4,347,621 | A * | 8/1982 | Dow | G21B 1/05 376/127 |
| 4,555,666 | A | 11/1985 | Martin | |
| 4,713,208 | A * | 12/1987 | Furth | H05H 1/12 376/128 |
| 5,015,432 | A * | 5/1991 | Koloc | H05H 1/04 376/148 |
| 5,032,717 | A * | 7/1991 | Roose | H01J 19/42 250/227.11 |
| 5,041,760 | A * | 8/1991 | Koloc | H05H 1/04 315/111.41 |
| 5,175,466 | A | 12/1992 | Seward, III | |
| 5,435,881 | A * | 7/1995 | Ogle | H01J 37/321 118/723 MA |
| 5,589,727 | A * | 12/1996 | Seward | H02J 15/00 313/231.31 |
| 5,773,919 | A * | 6/1998 | Seward | H02J 15/00 313/231.31 |
| 5,923,716 | A * | 7/1999 | Meacham | G21B 1/00 376/121 |
| 6,140,752 | A * | 10/2000 | Seward | H02J 15/00 313/231.31 |
| 6,477,216 | B2 * | 11/2002 | Koloc | H05H 1/04 315/111.21 |
| 6,603,247 | B1 * | 8/2003 | Seward | H02J 15/00 313/231.31 |
| 6,617,775 | B1 | 9/2003 | Seward, III et al. | |
| 7,087,142 | B2 * | 8/2006 | Wickersham, Jr. | C23C 14/3414 204/192.12 |
| 7,634,042 | B2 * | 12/2009 | Auchterlonie | H02J 4/00 376/141 |
| 7,968,838 | B2 | 6/2011 | Dent | |
| 9,125,288 | B2 * | 9/2015 | Edwards | G21B 1/05 |
| 9,655,221 | B2 | 5/2017 | Ziemba et al. | |
| 2002/0050828 | A1 * | 5/2002 | Seward, IV | G01N 22/00 324/652 |
| 2003/0001510 | A1 * | 1/2003 | Vahab | H05H 1/46 315/111.21 |
| 2003/0019204 | A1 * | 1/2003 | Seward | F03H 1/0093 60/203.1 |
| 2005/0249324 | A1 * | 11/2005 | Meacham | G21B 1/05 376/133 |
| 2011/0026657 | A1 * | 2/2011 | Laberge | H05H 1/16 376/133 |
| 2011/0026658 | A1 * | 2/2011 | Howard | G21B 3/006 376/133 |
| 2011/0142185 | A1 * | 6/2011 | Woodruff | G21B 1/05 376/121 |
| 2011/0243292 | A1 * | 10/2011 | Howard | G21B 3/006 376/133 |
| 2012/0033775 | A1 | 2/2012 | Santilli | |
| 2012/0097532 | A1 * | 4/2012 | DeLuze | G21B 3/006 204/278 |
| 2013/0057151 | A1 | 3/2013 | Curry | |
| 2013/0188764 | A1 * | 7/2013 | Seward | H05H 1/50 376/145 |
| 2014/0312770 | A1 * | 10/2014 | Seward | H05H 1/12 315/111.41 |

OTHER PUBLICATIONS

Zelikin, M.I., "Superconductivity of Plasma and Fireballs", Journal of Mathematical Sciences, vol. 151, No. 6, 2008, p. 3473-3496.

Cambier et al., "Theoretical analysis of the electron spiral toroid concept," MSE Technology Applications, Inc., Butte, Montana, NASA/CR-2000-210654, Dec. 2000.

Seward et al., "Ball lightening explained as a stable plasma toroid," Published 2001.

International Search Report and Written Opinion of the International Searching Authority for International Patent Application No. PCT/US15/16903 dated Jun. 1, 2015.

Tarucha, T. and K. Kadowaki, "Construction of the spatial scanning interferometer system with CO2 laser" (presentation), Jan. 8, 2014 [online]. Retrieved from the internet: http://www.sunist.org/shared%20documents/2014.1.6_A3_AII/140108am_08_Tarucha.pdf.

Lieberman, A Mini-Cource on the Principles of Plasma Discharges. 74 pages, (2003). Accessed Feb. 8, 2017 on the Internet at https://archive.org/details/flooved3044. (No publication month available; however, per MPEP 609.04 (a), Applicant submits that the year of publication is sufficiently earlier than the effective U.S. filing date and any foreign priority date so that the particular month of publication is not in the issue).

Seward, A Practical Colliding Spheromak Fusion Reactor Concept. Electron Power Systems, Inc. 1 page, Feb. 21, 2011.

Seward, Ball Lightning Explanation, Leading to Clean Energy. Seward Publishing Company, Acton, MA. 92 pages, (Feb. 10, 2011). http://www.lulu.com/content/10117874.

Seward, Long Range Atmospheric Defense (LRAD) using Spheromak Technology. Electron Power Systems, Inc. 8 pages, (2012).

Seward, White Paper: Colliding Spheromak Clean Energy Process. Electron Power Systems, Inc. 6 pages. Jan. 4, 2012.

Chen et al., Equilibrium and stability properties of self-organized electron spiral toroids. Physics of Plasmas. Oct. 2001;8(10):4441-4449.

Degnan et al., Compact toroid formation, compression, and acceleration. Phys Fluids B. Aug. 1993;5(8):2938-2958.

Hammer et al., Experimental demonstration of acceleration and focusing of magnetically confined plasma rings. Physical Review Letters. Dec. 19, 1988;61(25):2843-2846.

Kiuttu et al., Acceleration and compression of compact toroid plasmas. 1994 10th International Conference on High-Power Particle Beams. 1994;1:150-158.

* cited by examiner

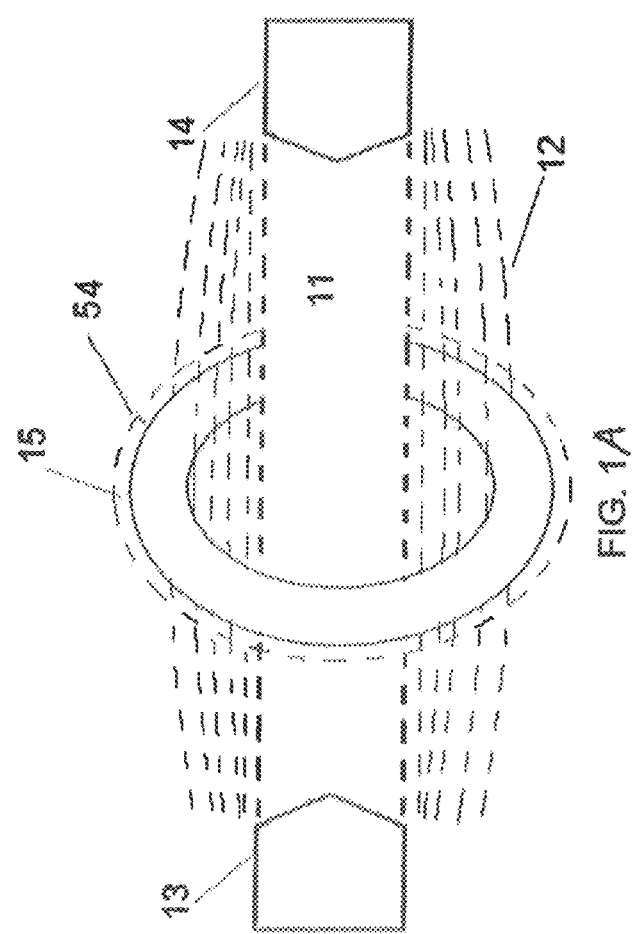

Fig. 9D — The ESTS at 300 msec as it first forms. Note the light appearance from low density.

Fig. 9E — The ESTS at 500 msec. Note the increase in density (brightness).

Fig. 9F — The ESTS at 700 msec. Note that density is still increasing.

Fig. 9G — The ESTS at 1000 msec. Note that the density is reducing.

SYSTEMS AND METHODS FOR GENERATING ELECTRON SPIRAL TOROIDS

CROSS REFERENCE TO RELATED APPLICATION

The present application is a continuation-in-part of U.S. application Ser. No. 13/737,519, filed Jan. 9, 2013, and claims priority to U.S. Application No. 61/631,733, filed Jan. 10, 2012 and also claims priority to U.S. Application No. 61/710,417, filed on Oct. 5, 2012, the entire contents of these applications being incorporated herein by reference.

BACKGROUND OF THE INVENTION

A spheromak can be defined as a toroidal shaped arrangement of plasma consisting of electrons and ions. Traditional spheromaks contain large internal electrical currents and their associated magnetic fields are arranged so the forces within the spheromak are nearly balanced, resulting in confinement times of about a few microseconds without any external fields.

Spheromaks can be generated using a "gun" type device that ejects spheromaks off the end of an electrode into a holding area called a flux conserver. This has made them useful in the laboratory setting for analysis, and spheromak guns are relatively common in astrophysics laboratories. Spheromaks have also been observed to occur in nature as a variety of astrophysical events, like coronal loops and filaments, relativistic jets and plasmoids.

Spheromaks have been proposed as a magnetic fusion energy concept due to their confinement times, on the order of a few microseconds, which was on the same order as the best Tokamaks when they were first being studied in the mid-twentieth century. Though they had some successes, these small and lower-energy devices had limited performance.

It has been demonstrated that hotter spheromaks have better confinement times, and this has led to a second wave of spheromak machines. Spheromaks have also been used as a mean of injecting plasma into a bigger magnetic confinement experiment like a Tokamak. However, there remains a significant need for improvements in the generation of stable toroidal shaped particle assemblies for a variety of applications.

SUMMARY OF THE INVENTION

The present invention relates to systems and methods for generating electron toroids. This is formed in partial or full atmosphere where it is observed to remain stable for hundreds of milliseconds with no external magnetic field for confinement. The charged particles in this spheromak produce a strong internal magnetic field. A spiraling path for the electrons in the surface of the spheromak produces a large internal magnetic field, hence the name of this type of spheromak: the Electron Spiral Toroid Spheromak (ESTS).

A preferred embodiment of the present invention provides a moving electrode system to initiate an ESTS. One or more electrodes can undergo controlled translation using a programmable control system. A computer can be programmed using software configured to control a data processor or microcontroller to transmit control signals to an actuator that enables motion of the electrodes and to adjust parameters used to form the toroid. The initiating voltage and the current across the arc formed between the electrodes are parameters selectable by the user to control formation and movement. A camera and system sensors can be used to provide feedback control of toroid formation.

This spheromak, the ESTS, is formed using a high current electric arc. The arc is preferably formed in partial atmosphere, and the ESTS is formed around the arc. Instead of forming spheromaks in high vacuum, preferred embodiments of the present invention form them in partial to full atmosphere. The ESTS formed in this manner is observed to remain in place around the arc for the duration of the arc, which has been observed for hundreds of milliseconds.

ESTSs have also been observed to pass through the arc and leave it entirely. When an ESTS leaves the arc, it passes through the magnetic fields of the arc while maintaining ESTS stability and shape. It is observed to remain stable after it is removed from the arc, with no external magnetic field for confinement, and spins at a high rate. High speed cameras have demonstrated that the shape is that of a spheromak by capturing images at a very fast shutter speed, fast enough to capture the ESTS image in mid spin. Also, in cases where the ESTS is removed from the arc, it is observed to endure for hundreds of milliseconds, for example, and can be moved by applying a directed magnetic field.

In a preferred embodiment of the ESTS, the invention provides a class of spheromak that is formed in partial atmosphere in contrast to formation in a high vacuum. This class of spheromak is formed around an electric arc. The spheromak is observed to endure for many milliseconds, a longer time than the tens of microseconds of traditional spheromaks when no external confining magnetic field is used.

A preferred embodiment of the invention includes a method of making a toroid having an ion concentration of at least $10^{16}$ ions/cm$^3$ and preferably in a range of $10^{16}$ ions/cm$^3$-$10^{20}$ ions/cm$^3$. Such high density ion assemblies can be formed by modulating an arc current in a selected atmosphere at a controlled temperature and pressure. Alternatively, a constant current power supply can be used that can maintain a selected current level during formation of the toroid. Consequently, as current is drawn from the arc to form the toroid, the regulation circuit automatically compensates to maintain the selected current level and thereby achieve the desired ion density in the toroid.

A preferred embodiment uses a sensor system, such as optical interferometry to measure the ion density in the toroid. With calibration of the measured density signal, the density measurement system can provide a feedback signal to control toroid formation. The sensor system can also measure additional characteristics of the toroid including size and shape and also be used to automate toroid formation and movement.

In addition to describing the ESTS, described herein is a system for accelerating the ESTS once it has been formed. This enables a user to add energy to the ESTS. The accelerated ESTS has several applications including x-ray generation, particle beam accelerator, or an improved colliding spheromak energy generator. A magnet coil system can be positioned, for example, relative to the arc to move the toroid after formation.

BRIEF DESCRIPTION OF THE DRAWINGS

FIGS. 1A-1B are schematic views of a preferred embodiment of the Electron Spiral Toroid Spheromak (ESTS) invention showing an ESTS formed around an initiating arc.

FIGS. 9A-9G is a photograph of an arc prior to ESTS formation.

DETAILED DESCRIPTION OF THE INVENTION

A spheromak is a toroidal shaped arrangement of plasma consisting of electrons and ions. A typical spheromak has a toroid shape in a three-dimensional configuration. Additional details regarding prior systems for producing electron toroids can be found in U.S. Pat. No. 6,603,247, the entire contents of which is incorporated herein by reference.

Shown in FIG. 1A is a schematic diagram of a view of a preferred embodiment of the invention. The elements required to initiate an Electron Spiral Toroid Spheromak (ESTS) are an electric arc 11, between an anode 13 and a cathode 14. The arc is formed in partial or full atmosphere in a chamber. Collisions of the arc electrons with the background gas create ions 12. When the operating parameters are correct, such as voltage, pressure, arc distance and speed of the moving electrodes, an ESTS 15 forms within the chamber.

The methods for forming an electric arc suitable for formation of an ESTS require stability and duration. The arc must be stable for a period of time, compared to arcs that are often unstable in the sense that they change arc paths rapidly and often.

The arc current value is also important. For arcs of approximately five to eight centimeters of arc length, for example, the current is found to range from 200 to 600 amperes. At this value, the arc has an essentially uniform external magnetic field. As electrons leave the arc, they are acted on by the arc magnetic field which causes them to assume a toroidal orbit around the arc. When enough electrons have left the arc, they produce the ESTS. It is important to note that the arc channel itself must be narrower than the path of the electrons around the arc such that the electrons leave the arc that do not collide with the particles remaining in the arc itself.

Figure 1B:
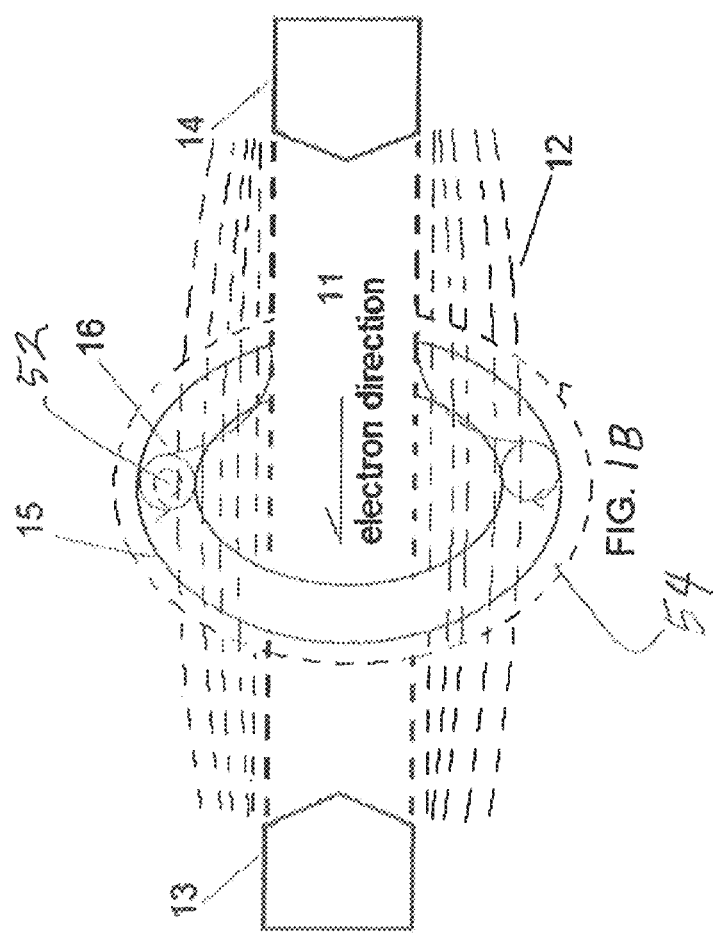

Positively charged ions from around the arc are trapped within or around the ESTS surface during formation. These ions serve to electrically neutralize the toroid within the housing. As shown in FIG. 1B, electrons leave the arc substantially simultaneously and curl around in response to the magnetic field to form the toroid. The ions situated within the toroid 52 or outside the toroid 54 can form boundary layers with a charge gradient operative to dynamically neutralize a region or envelope around the toroid.

There is a critical point in toroid formation at which the electron velocity within the arc is sufficient and the arc current decreases when field conditions enable toroid formation. With a capacitor system power supply, the voltage across the arc can drop as the arc draws power which results in a decrease in the current. This is coordinated with the increasing distance between the electrodes which increases the resistance between the electrodes. Because the current decreases faster than the decrease in electron velocity, for example, this can enable toroid formation.

More specifically, when the electrodes are employed for initiation in which they are initially touching, the circuit resistance is at its lowest value. At this time, the capacitor power supply can provide a maximum voltage and current when fully charged and can potentially damage the electrodes, for example. To mitigate or eliminate this possibility, a variable resistor or other voltage control device can be used to adjust the initial voltage and current to control the arc and further control initiation of one or more toroids with the arc. In a preferred method, the initial voltage at contact is increased for a first time period upon electrode separation for about 100 milliseconds, for example. However, as the electrode separation increases and more gas particles enter the electrode gap, the resistance in the gap increases causing a reduction in the voltage (and current) across the gap, assuming that the voltage is not increased further by the voltage controller. The exact voltage and current for toroid formation will vary as a function of system resistance, electrode materials, gas pressure, arc gap length and power supply characteristics. In a preferred method, the invention includes a process for generating a plurality of toroids using a single arc sequence. In this embodiment, after formation of a first toroid as described above, the voltage/current across the arc can be reduced to a level that allows the first toroid to be released from the arc. However, the residual arc ions remain in place long enough, even if the arc is temporarily disrupted, for up to a few hundred milliseconds. This enables the system to then increase the voltage/current and reestablish the arc to enable repetitive formation of a plurality of toroids in sequence.

Note that the ESTS has an essentially uniform geometry, that is, the charged particle orbits within the ESTS are nearly the same at all points of the ESTS. This occurs when enough electrons leave the arc and form the essential toroid shape that they in turn create their own magnetic field internal to the ESTS. When this state is reached, then the internal fields in the ESTS ensure that the radius of each orbit is essentially the same for all orbits. At this point the ESTS is stable and is self-organized (that is, confined without an external magnetic field) as described by Chen, C., Pakter, R., Seward, C. in "Equilibrium and Stability Properties of Self-Organized Electron Spiral Toroids," Physics of Plasmas, Vol. 8, No. 10, 2001, and also U.S. Pat. No. 6,617,775 the entire contents of the publication and this patent being incorporated herein by reference. It is also observed to endure in partial atmosphere for hundreds of milliseconds, and as the energy level of the toroid increase, the toroid can endure for minutes. Ions from around the arc are trapped within ESTS surface during formation when the electrons leave the arc and move into the toroid shape, positively charged ions are entrained with the toroid surface.

Figure 2A:
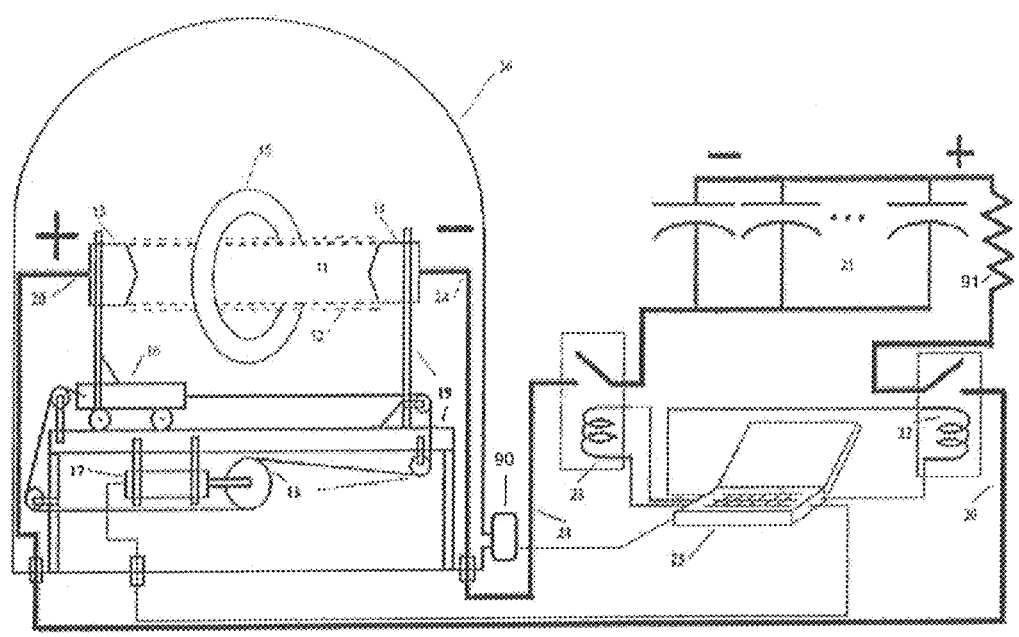
FIG. 2A is a schematic view of the apparatus used to produce the ESTS with a moving frame used to separate the electrodes.

FIG. 2A is a schematic of the initiating apparatus for the ESTS. ESTS formation takes place in a significant atmosphere of background gas, from partial to full atmosphere. The methods for obtaining a partial vacuum are well known such as forming the partial vacuum in a bell jar 26 or other vacuum chamber evacuated using a vacuum pump 90. This operating region can be backfilled with nitrogen to the appropriate pressure. ESTSs forming in pressures from one Torr to 300 Torr were observed, but they can form in higher pressures up to one atmosphere and even higher with selected changes in voltage and spacing.

The electric arc used is formed with electrodes 13 and 14. The arc is formed by first placing the electrodes together then applying voltage enough to maintain the arc across the gap as it is drawn. The electrodes are then drawn apart using the moving frame 16 until the full arc gap is opened, with just the anode on the moving frame, while the cathode is on the fixed frame 19. A motor 17 is used to pull apart the electrodes using a series of simple pulleys 18 and a cable. The fixed frame 19 holds in place the motor, pulleys, and cathode. During the arc drawing process, the arc current can be increased to higher levels which might be harmful to the electrodes when they are touching, but act to increase the arc current later in the process.

Initially, exploding wires were used to generate the arcs. However, the exploding wire needs to be replaced after each event, making difficult ESTS applications which utilize many ESTSs formed in rapid fashion, while the drawn arc approach described herein uses the same electrodes for many arc events. The exploding wires leave a residue which needs to be cleaned and removed after each arc event. Thus the drawn arc system is more useful and efficient for repeated arc formation.

The voltage required across the arc gap is dependent on the gap length, the background gas pressure, and the material used in the electrodes. For a gap length of 8.5 cm, for example, system voltages of 110 VDC to 125 VDC have been shown to produce ESTSs in various pressures. Lower background gas pressures require lower voltages since it is easier to maintain an arc across a gap at lower pressures. Higher voltages have been used also, and there is no upper voltage limit, but as a rule, the voltage has to be low enough to allow electrons to escape the arc.

An electron gun can be used in place of electrodes, except that current electron guns used to produce electron beams do not have the current capability of arcs. Electron guns from Kimball Physics, for example, normally provide maximum currents in the tens of milliamperes range, well below the range needed for ESTS formation. The arcs used in this invention range from a few tens of amperes to thousands of amperes. FIG. 2A shows the power supply, 21, which comprises a capacitor bank. Batteries can be used, as well as other appropriate power supplies. For a preferred embodiment, the arcs range from 200 to 600 amperes, but with specific design requirements, a wide range of currents can be utilized, allowing one to configure the ESTS to fit many applications. To control the current, a variable resistor 91, or similar current limiting device can be placed at the capacitor output.

For the preferred embodiment, the pressure used is preferably about $\frac{1}{8}^{th}$ atmosphere. The pressure can vary greatly and ESTSs have been observed from 0.10% atmosphere to 36% atmosphere with adjustment of system parameters. The lower limit is the density of the background gas as there must be enough gas molecules to form sufficient ions to neutralize the electron charge.

For a preferred embodiment, the measurements of toroid properties can use a background gas of nitrogen, since it is easy to obtain and will not react with the electrodes as they become heated during arc formation. Other inert gases can be used, and argon and helium have been used, for example. Air can be utilized, although it can be harmful to the electrodes since the oxygen can rapidly react with the heated electrodes. Hydrogen can be used, but care must be taken to provide for safety by ensuring that oxygen is not mixed with the hydrogen. Ions sources can also include deuterium, boron, pure nitrogen, xenon, copper, silicon, and calcium.

Referring again to FIG. 2A, the control panel or processor for the arc apparatus is shown schematically as 25, wherein the control panel starts the apparatus by first actuating the contactors 22 and 23 when the electrodes are touching in order to heat the electrodes and to initiate the current. Power is applied to the electrodes using the cables 20 and 24. The controller 25 then actuates the motor to draw the anode 13 and, when conditions are correct, to form the arc and draw it the full length of the arc gap.

There is a limit to how fast an arc can be drawn. If drawn too fast, the arc will extinguish because it will not maintain the arc path. It is desirable to draw fast enough that the ESTS initiates before the capacitor supply discharges enough energy to drop below an output voltage that maintains the arc. Preferably, a draw of 8.5 cm in 0.45 seconds, or about 19 cm/second can be used, however, this value can vary range from 10-50 cm/second.

In one embodiment, the ESTS remains in place as long as the arc remains, which is controlled by the control circuit. In a second embodiment, the ESTS is observed to become self-stable independent of the arc. As the ESTS remains in place, under the right conditions it is observed to increase in density with time. When the ESTS becomes dense enough it is observed to move through the arc and become self-stable in the partial atmosphere. The necessary condition for this to happen is for the internal magnetic field of the ESTS to be greater than the arc magnetic field itself such that the ESTS can cross the magnetic field lines while maintaining its toroidal shape.

To calculate the magnetic field of the arc and the ESTS internal magnetic field, the arc magnetic field is $Ba=\mu*Ia/2\pi*Ra$, where Ia is the arc current, and Ra is the arc radius. For a typical experiment, with Ia=330 amperes, and Ra=0.0069 m, Ba=0.0097 Tesla.

The ESTS is observed to pass through this field while remaining stable and to do so the ESTS internal magnetic field must be greater than the field of the arc by an approximate order of magnitude (ten times). The ESTS internal magnetic field $Bt=Ns*\mu*It/2\pi*Rt$, where Ns is the number of electron shells in the ESTS surface, It is the toroidal current in a shell, and Rt is the ESTS radius. For a typical measurement where the ESTS is observed to cross the magnetic field lines of the arc, it is estimated that Ns=25, Is=10,400 A; Rt=0.0137 m resulting in Bt=3.8 Tesla, which is greater than the arc magnetic field.

Figure 2B:
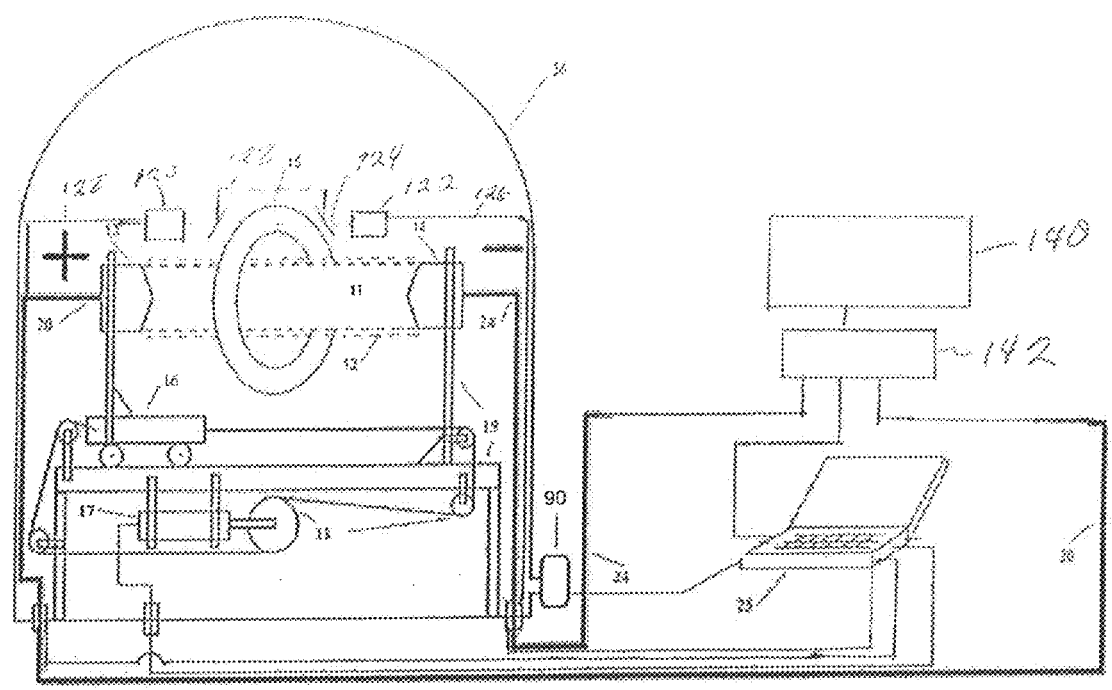
FIG. 2B is a schematic view of a further preferred embodiment of a system for generating high density charged particle toroids.

FIG. 2B illustrates another preferred embodiment of a system for generating an arc that is used to generate a charged particle toroid in accordance with preferred embodiments of the invention. A power source 140 can be used in conjunction with a constant current control system 142 that enables the formation of toroids with a controlled ion density and size.

The toroid 15 characteristics such as size and current density can be optically measured using interferometry in which a light source 120 transmits a light beam 124 and a detector system 122 detects light that is transmitted through the arc. Size and geometry can also be measured using CCD or CMOS imaging camera. A reference beam 128 can be separated from the beam transmitted (or reflected) through the arc using a beamsplitter. The reference beam 128 and transmitted beam 124 can be combined with a second beamsplitter. A change in the phase relationship between the transmission beam 124 and the reference beam 128 is correlated with the ion density.

Figure 3:
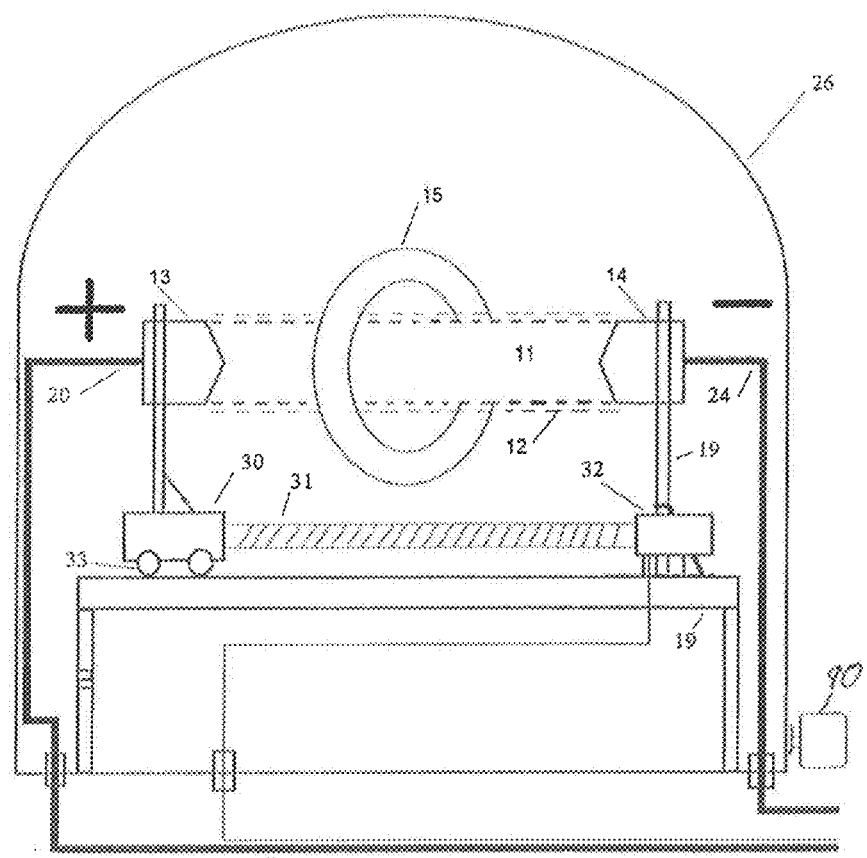
FIG. 3 is a schematic view of the apparatus used to produce the ESTS with a screw motor used to move the electrodes in place of the moving frame.

FIG. 3 shows a further improvement to the apparatus for drawing the arc. In this embodiment the moving frame and motor used to draw the arc are replaced by a simple screw and motor arrangement to move an electrode. Referring to FIG. 3, the anode is mounted to a moving frame 30. The moving frame is attached to a long screw 31 that is turned directly by a motor 32. As the motor is made to turn in one direction, it moves the moving frame away from the motor, thus drawing the arc. Similarly, as the motor is made to turn in the opposite direction, it moves the moving frame toward the motor and thus makes the electrodes touch in order to start another arc event. On the moving frame are shown wheels 33 used to maintain the orientation of the moving frame such that it remains level as the screw turns. Note that metal features are shielded from the arc in order to prevent the arc from finding an unintended ground and jumping from its intended arc path.

Figure 4:
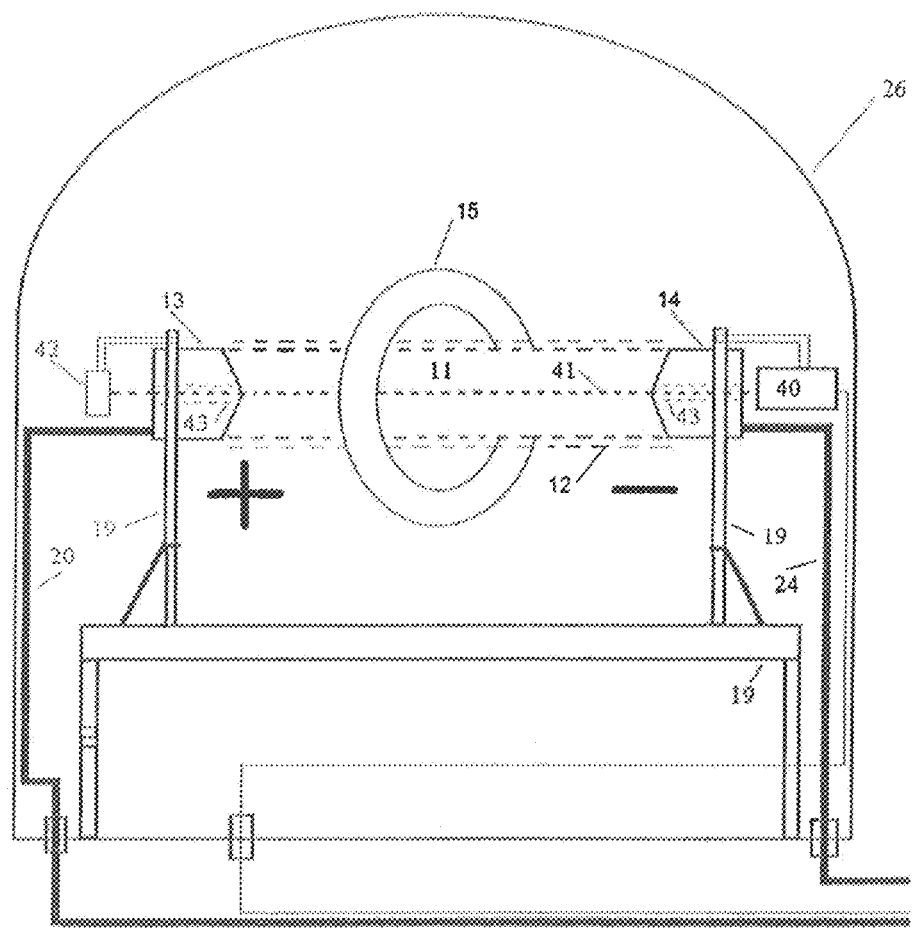
FIG. 4 is a schematic view of the apparatus used to produce the ESTS with a laser used to initiate the arc instead of the moving electrodes.

FIG. 4 shows a further improvement to the apparatus for drawing the arc. In this embodiment, the moving frame and motor used to draw the arc are replaced by a stationary laser that is used to ionize the background gas so as to establish an ion path from anode to cathode, which causes the voltage between electrodes to establish a current path and therefore an arc between the electrodes. Referring to FIG. 4, the anode is mounted to the stationary frame 19. A laser generator 40 is attached to the stationary frame such that its laser path 41 will travel through the cathode 14 and then through the anode 13 to hit the laser target 42. Note that the electrodes each have a hole through their center 43 to allow the laser to pass through. The laser causes the background gas to ionize and in so doing, allows the electric arc to form without the need for drawing the arc. Note that the laser generator and laser target must each be insulated from the anode and cathode in order to prevent the arc from finding them as an unintended ground and jumping from its intended arc path.

Figure 5:
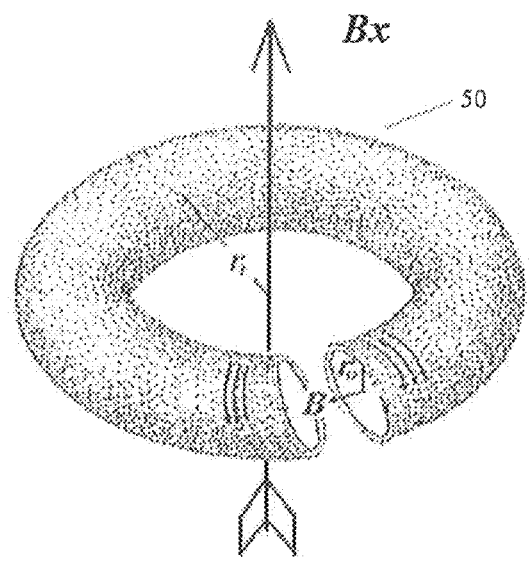
FIG. 5 is a schematic of the ESTS.

FIG. 5 is a schematic view of the ESTS 50 as a stand-alone entity. It shows the typical toroidal shape of the spheromak, and the hollow center of the ESTS. The internal magnetic field is shown as B. The radius of the orbit of the charged particles is $r_O$ and is essentially uniform for all charged particle orbits. The radius of the ESTS is $r_T$ and is essentially uniform for the entire ESTS. The electron shell is shown in a dotted manner as the outer shell. The spiraling of the electrons is shown by the parallel arrows, showing that the electron paths are parallel as the electrons spiral around the toroid. Also shown schematically is a continuous shell, representing the internal ions that neutralize the electron space charge, noting that external ions are observed as well, and can contribute to neutralizing the space charge. Calculations show that the model supports many shells of electrons and shells of ions. Also shown is the external magnetic field of the ESTS, labeled Bx, which results from the current caused by the spiraling motion of the charged particles in the ESTS. This external magnetic field is much less in magnitude compared to the internal magnetic field, but is important because it allows the ESTS to be transported and accelerated.

With this level of detail visible it is important to point out that during the initiation of the ESTS as shown in FIG. 1, the radius of the ESTS is greater than the radius of the initiating arc by an amount such that the orbit radius of the particles does not collide with the arc itself. This is helped by the background gas which acts to produce a narrow arc channel.

Figure 6:
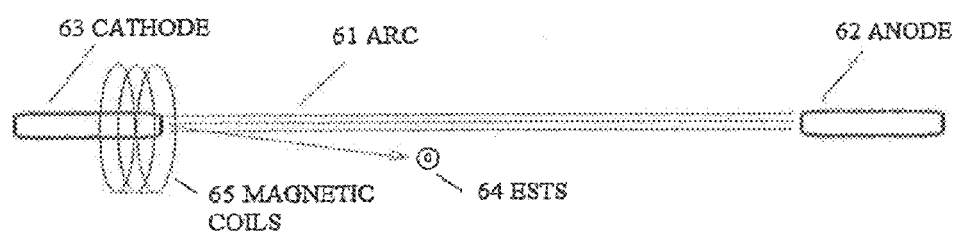
FIG. 6 is a simplified schematic view of an ESTS accelerator.

FIG. 6 is a simplified schematic diagram of an accelerator for the ESTS. The system enables small ESTSs in arcs that moved in random directions along the arc path or out of the arc path. Measurements and analysis have showed that they were self-organized and stable as described above and in the references, and that they could pass through the magnetic fields of the arc while retaining their shape. They are typically of small diameter of 0.2 cm to 0.5 cm. They were observed to form directly at the cathode or sometimes at the anode. Their size is consistent with the hot spots which form on the anode or cathode and from which the arc is seen to emanate. An electric arc consists of an accumulation of small arcs that form at individual hot spots, which explains how small ESTSs form during a larger arc event.

Further measurements demonstrated that these small ESTSs can be accelerated using magnetic coils. FIG. 6 shows the arc 61 formed between an anode 62 and a cathode 63. Under the right conditions of pressure, voltage, and current, many small ESTSs 64 were observed. When magnetic coils 65 were added and energized, the ESTSs were observed to accelerate. When accelerating the ESTS, care must be taken to keep the accelerating magnetic field below the level of the internal magnetic field of the ESTS or else the ESTS itself will lose its shape and stability, and can dissipate.

Figure 7:
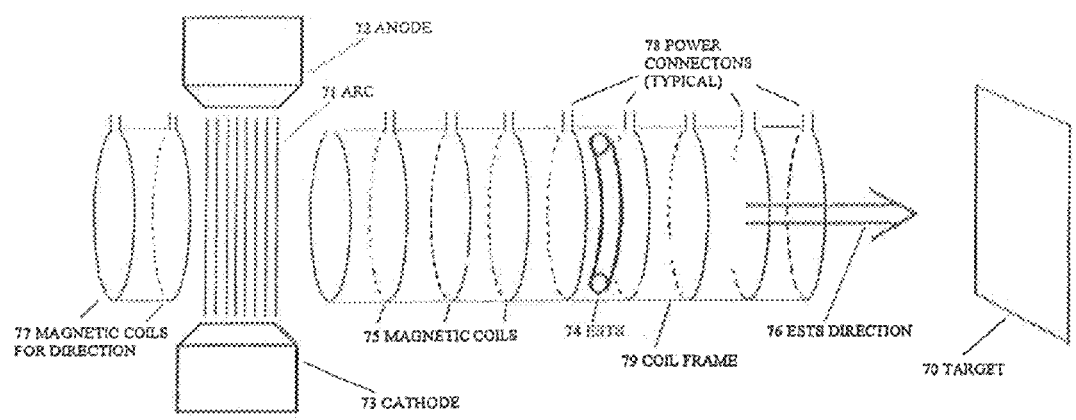
FIG. 7 is a more detailed view of an ESTS accelerator.

FIG. 7 illustrates that the ESTS is formed by an arc 71 formed between the anode 72 and the cathode 73. As described above, the ESTS 74 forms under appropriate conditions of voltage, current and pressure. Magnetic coils 75 accelerate the ESTS in the direction shown 76 when energized with a selected current. Magnetic coils for direction are shown as 77 to direct ESTSs once they are formed in the arc. Power is connected to individual coils of the magnet coil assembly with power connections 78. A frame 79 for holding the coils in place that can optionally be located inside the coils and made of a material such as ceramic which will help to guide the ESTS during its acceleration. A target, shown as 70, has various purposes depending on the application. The power supply for the coils and the control circuits to turn the coils on in succession to accelerate the ESTS are also known.

The basic equations for a solenoid magnetic field accelerator of an electron spiral toroid spheromak using an applied magnetic field pulse are presented here. Measurements have shown that when a static magnetic field is applied, accelerations of the ESTSs up 6000 m/s$^2$ have been observed. The theory of self-organized ESTSs has been developed to describe the confinement and stability of self-organized EST's.

Consider the magnetic coil ESTS accelerator shown schematically in FIG. 7. For simplicity, let us make the following assumptions:

(a) The power supply is characterized by its capacitance C and inductance L.
(b) The solenoid wires are perfect conductors.
(c) The ESTS internal magnetic (self-magnetic) field is much greater than and orthogonal to the applied magnetic field produced by the solenoid.
(d) The EST has such a high conductivity that it shorts the circuit.

Under these assumptions, the entire system can be treated as a circuit consisting of the power supply and the solenoid shorted by the ESTS. The circuit equation for the system is $$L_T(z)\frac{d^2I}{dt^2} + \frac{I}{C} = 0, \quad (1)$$

where $L_T(z)$ is the total inductance of the system, and I is the current flowing down the solenoid. Let $dL_0/dz$ be the inductance of the solenoid per unit axial length, and then the total inductance can be expressed as $$L_T(z) = L + \left(\frac{dL_0}{dz}\right)z, \quad (2)$$

where we have assumed that the solenoid starts at $z=0$ and z is the axial position of the center of the ESTS. The equation of center-of-mass motion of the ESTS can be derived from magnetohydrodymanics (MHD) (Schmidt, 1979). To summarize, the self-consistent equations governing the ESTS acceleration are $$L_T(z)\frac{d^2I}{dt^2} + \frac{I}{C} = 0, \quad (3)$$

$$L_T(z) = L + \left(\frac{dL_0}{dz}\right)z, \quad (4)$$

$$M\frac{d^2z}{dt^2} = \frac{1}{2}\left(\frac{dL_0}{dz}\right)I^2, \quad (5)$$

where M is the ESTS mass. These coupled equations can be solved simultaneously to predict the trajectory of the ESTS. It should be noted that equations (3)-(5) have the same form as those obtained and verified (Hammer, et al., 1988) for the compact toroid accelerator reported by (Hammer, et al., 1988; Degnan, et al., 1993; Kiuttu, et al., 1994).

Figure 8:
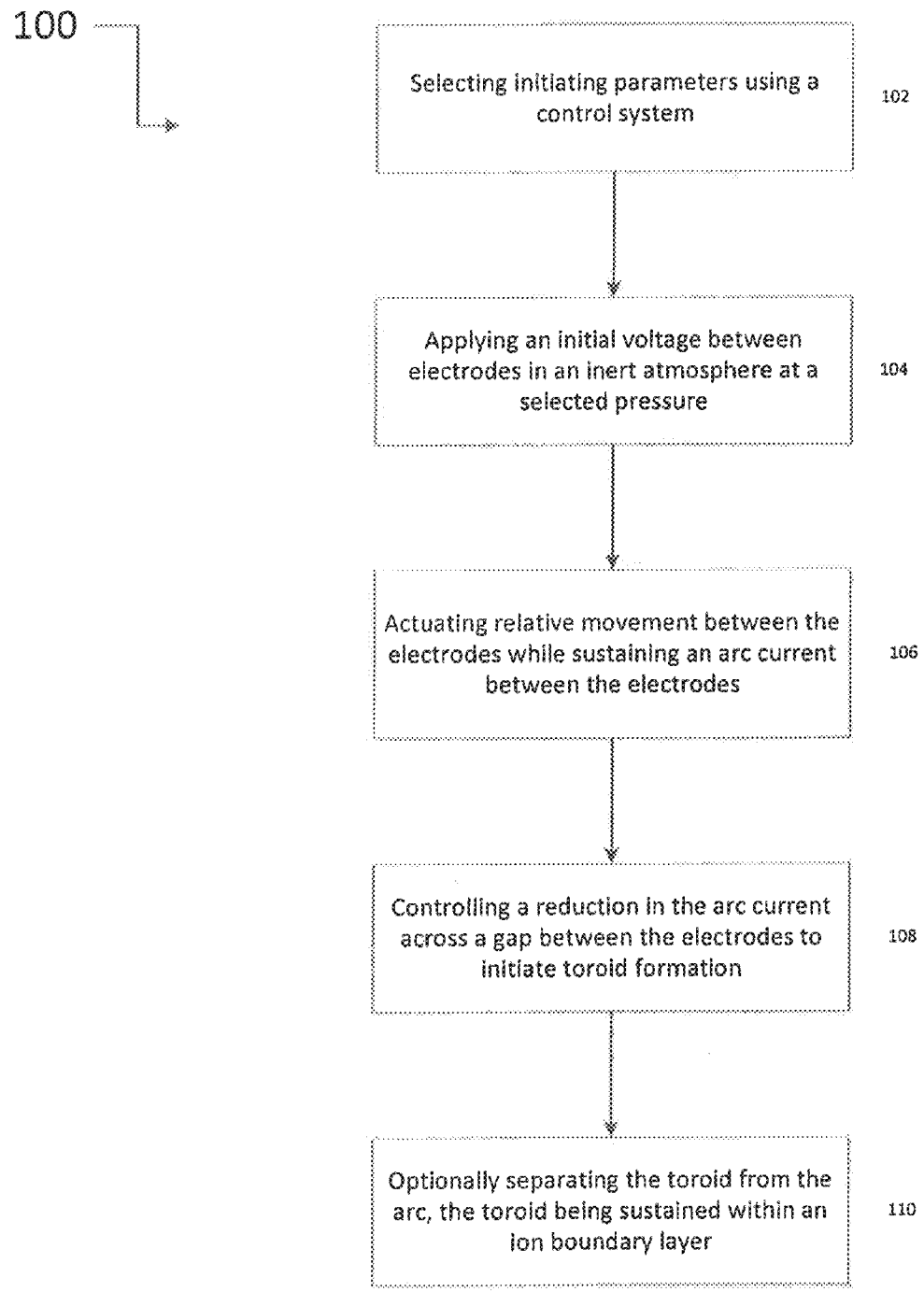
FIG. 8 is a process sequence for controlling formation of a toroid using a control system.

Illustrated in FIG. 8 is a process sequence 100 in which a programmable control system is used to initiate a toroid. Software is used to issue instructions to system components to control timing of arc formation. The process is initiated when the user selects parameters 102 such as electrode spacing separation velocity, gas pressure and initiating voltage 104. Actuators are instructed to provide for movement 106 of one or both electrodes to increase the gap. The arc current is reduced or attenuated in a controlled manner such that a toroid forms 108. The toroid can optionally be removed 110 from the arc by selective modulation of the arc and magnetic field conditions. The toroid formation process can optionally be repeated as described herein.

Figure 9A:
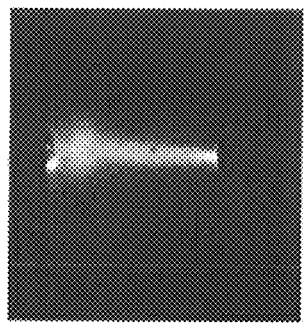
Figure 9A:
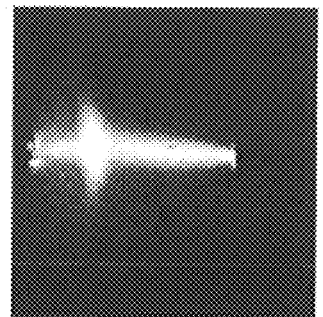
Figure 9A:
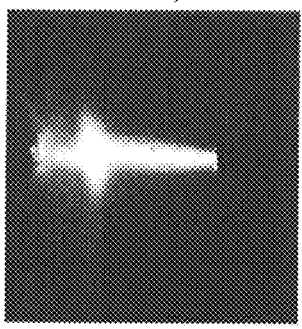
Figure 9A:
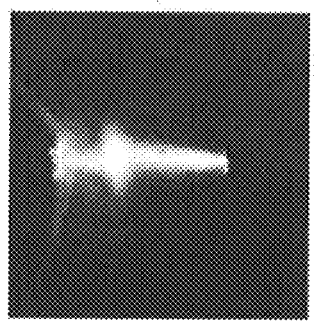
Figure 9A:
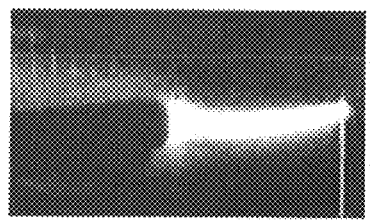
Figure 9B:
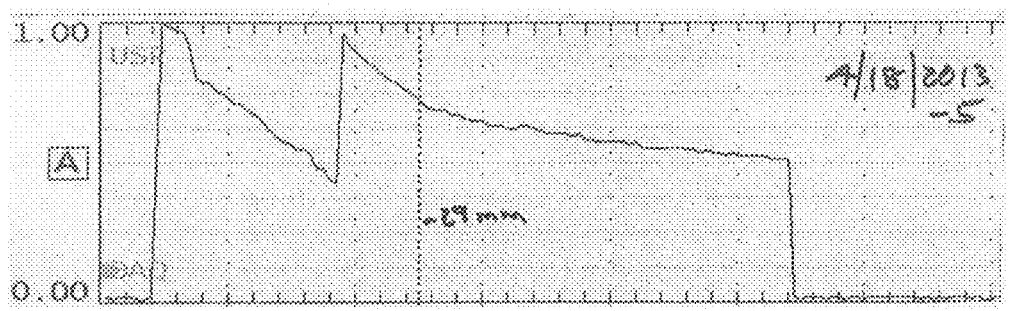

Shown in FIG. 9A is a photograph of an arc used for initiation of the toroid. The measurement of the density of the ESTS to be greater than $10^{17}$ ions/cm$^3$ with no externally applied confining toroidal magnetic field. Note that the formation of the ESTS caused a significant change in the current of the arc. FIG. 9B shows the normal arc current characteristic when no ESTS is present. The power supply is capacitive as described previously herein and exhibits an exponential curve. For explanation, the trace shows the characteristic of a drawn arc, with the electrodes touching at the start, the drawing apart, and, at approximately 360 msec, a significant increase in current. This dual current approach can be used to protect the electrodes at the start of the event.

Figure 9C:
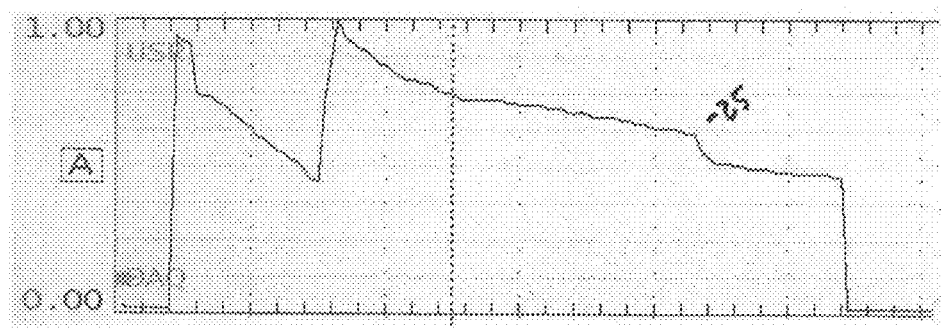

FIG. 9C demonstrates that the arc current undergoes a significant change occurring at the time that the ESTS forms. This change in current is measured as 5 mm on this trace, but because three power supplies are used to reach the current required, and three traces are made during each event, the total current is measured as 18.4 amperes for 40 msec, or 0.737 Coulombs of charge per 40 msec. This current goes directly into the ESTS, which is consistent with the video observations. Because this is a charge neutral assembly of positive ions and electrons, no magnetic confinement is needed to hold this charge in place.

The measurement example ends at approximately 1,080 msec. In this case, the ESTS was still forming at 200 msec at the end of the measurement, for a full charge of 3.68 Coulombs.

The density of the ESTS can be estimated using this initial estimate of charged particles. The ESTS volume is calculated as $7.7\times10^{-7}$ m$^3$ with a toroid radius of 0.00625 m and orbit radius of 0.0025 m. Density is the electrons/volume calculated as $2.98\times10^{25}$ electrons/m$^3$ or $2.98\times10^{19}$ electrons/cm$^3$ in this example. Because the number of positively charged ions and electrons has to be essentially equal to ensure charge neutrality, the ion density is the same as the electron density, or $2.98\times10^{19}$ ions/cm$^3$. The computer model calculates the density as greater than $10^{17}$ ions/cm$^3$ and supports densities greater than $10^{19}$ ions/cm$^3$.

FIGS. 9D-9G show the ESTS at different times during the formation sequence. It is a side view only, and the shape is a band rather than the more characteristic toroidal shape of FIGS. 10 and 11. These figures show the increasing density with time, which appears visually as increased brightness. The density reduces late in the measurement as the power supply discharges and is unable to maintain the conditions necessary to increase the density. With a longer initiation time, the density will increase above the critical density needed to remain stable.

Figure 10:
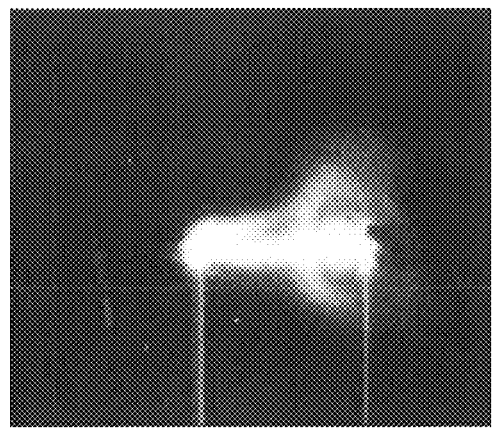
FIG. 10 is a photograph of an ESTS during formation around an arc.

The observed data relative to the ESTS in FIG. 10 demonstrate the ESTS equilibrium of forces. The radius of the toroid in FIG. 10 is observed as 0.033 m, and the radius of the electron orbit is observed as 0.0066 m, resulting in an overall diameter of 7.9 cm, with an aspect ratio of 5:1. The pressure is 0.125 atmospheres of nitrogen. The electron energy in the surface of the ESTS is estimated as $10^{-6}$ eV with electron velocity of 593 m/s. Generally, it is advantageous to have a diameter of the toroid in a range of 2 cm-8 cm.

In analyzing this system, a first assumption is that the electrons are equally spaced, providing a geometric ratio of orbit distance to electron distance of $k_O=0.87$. Second, the model also assumes an ion fraction utilized in the estimate of 1.001. Finally, $d_e$ and $d_i$ are assumed to be close, with $d_i$ smaller by the ion fraction. Because the background pressure provides the restoring force, $d_e$ is calculated as $7.69\times10^{-8}$ m, at which value the forces within the ESTS are in equilibrium.

The initial model demonstrated equilibrium for an electron surface of a single electron shell a single electron thick, and similarly, an ion surface a single ion thick. The reason for this one shell was a tacit assumption that the ESTS contained only particles captured within the ESTS volume at time of formation. However, observations suggest that this limitation is too restrictive. The ESTS forms around the arc and is seen to continue to accumulate charged particles for as long as initiating conditions remain in place, observed for a few hundreds of msec, for example.

The model has been extended here to an ESTS with multiple thin shells. This suggests that an electron shell is the outermost surface, with an ion shell next, then an electron shell, then an ion shell, and so forth. The alternating electron and ion shells can maintain charge neutrality. This series of shells can continue to accumulate as long as the force balance remains in equilibrium, which by this model is limited by the total internal magnetic field strength because it increases with the increasing number of shells.

The balance of forces holds for each shell. In addition, the number of shells sets the overall limit to the number of charged particles by setting the limit to the internal magnetic field, which acts to repel electrons. The example analyzed here achieves the balance of forces up to a maximum of 486 shells, and a total of $2.67 \times 10^{-10}$ Coulombs of charged particles. The internal magnetic field at these values is 6.09 Tesla, using the formula for a closed solenoid. The equations above have been incorporated into a computer model of the ESTS.

Figure 11:
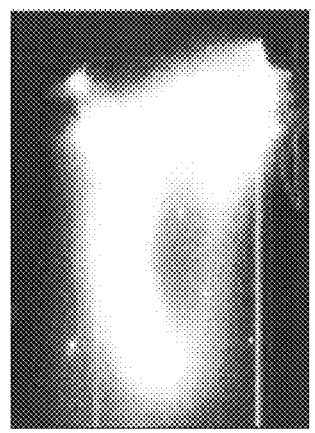
FIG. 11 is a photograph of an ESTS being removed from an arc.

The ESTS in FIG. 11 is observed to endure in ⅛ atmosphere of nitrogen before passing out of the field of view of the measurement. Pressures are preferably in the range of 1/16 atmosphere to ½ atmosphere. ESTSs formed by an arc and leaving the arc are normally spinning rapidly after initiation. In FIG. 11 the spinning has been effectively slowed using a high-speed video camera at 1/10,000 second shutter speed.

Figure 12:
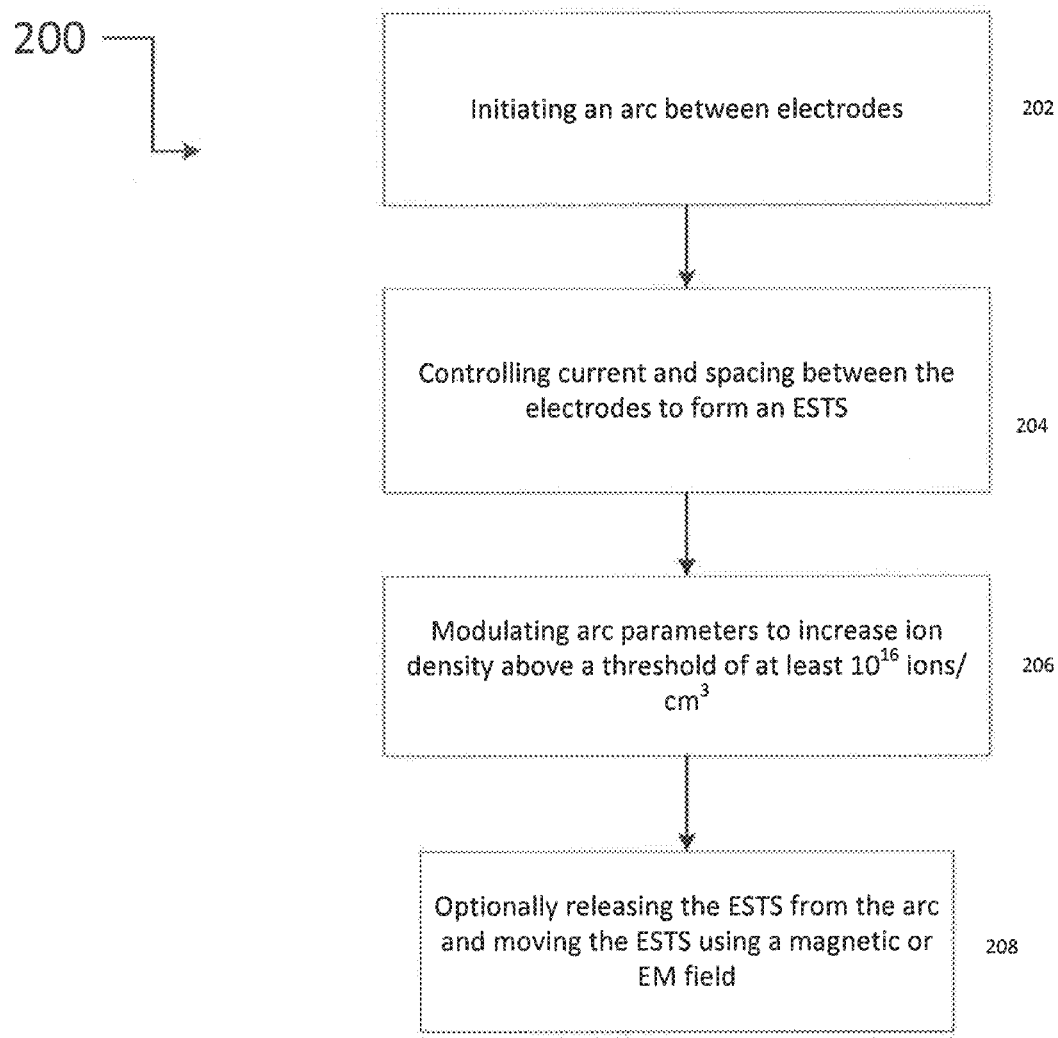
FIG. 12 is a process sequence for controlling ion density in an ESTS during formation.

The arc system described herein enables large, high density ESTSs that are 8 cm in diameter or larger, for example, as shown in FIG. 10 and FIG. 11. First, it was necessary to form stable arcs of high energy, which was done as shown in FIG. 9A. The arcs accommodated currents in a wide range, from hundreds of amperes to a few thousand amperes. The arc current can be regulated as shown in FIGS. 9B and 9C, which show current level between the electrodes as a function of time. The current can be stepped or modulated after the electrode spacing reaches an initiation distance. As shown in FIGS. 9D-9G, in this example photographs show the growth of the ESTS at 300 msec, 500 msec, 700 msec and 1000 msec. The density peaks as charge is added to the ESTS at a rate that exceeds the decay rate. As shown in the process flow diagram 200 of FIG. 12, the ion density of the ESTS can be formed to exceed a threshold prior to release from the arc. After initiation of an arc current 202, the current and spacing between the electrodes is controlled 204. By adjusting of the arc parameters 206, a toroid having an ion density above a threshold of at least $10^{16}$ ions/cm$^3$ can be obtained. A magnetic field can be used to move 208 the toroid after formation.

It will be appreciated by those skilled in the art that modifications to and variations of the above-described systems and methods and equivalents thereof may be made without departing from the inventive concepts disclosed herein. Accordingly, the disclosure should not be viewed as limited except as by the scope and spirit of the appended claims.

What is claimed is:

1. A method for generating a toroidal flow of ions around an electric arc comprising:
    regulating gas pressure within a chamber;
    applying a controlled electric voltage across a gap separation distance between a first electrode and a second electrode to generate an electric arc that extends along an arc path;
    adjusting the electric voltage across the gap separation distance with a controller to generate a toroidally shaped ion flow around the electric arc, the ion flow having an ion density of at least $10^{16}$ ions/cm$^3$;
    increasing the gap separation distance between the first electrode and the second electrode in response to control signals from the controller; and
    moving the toroidally shaped ion flow generated around the electric arc in a direction away from the arc path.

2. The method of claim 1 further comprising actuating relative movement between the first electrode and the second electrode with an actuator.

3. The method of claim 2 further comprising actuating said movement with a motor.

4. The method of claim 1 further comprising moving at least one of the first electrode and second electrode from an arc ignition position to an operating position.

5. The method of claim 1 further comprising increasing electric voltage across the arc path from an initial arc voltage to an operating arc voltage.

6. The method of claim 5 further comprising subsequently decreasing the operating voltage.

7. The method of claim 5 wherein the separation distance is in a range of 0-30 mm in the ignition arc position and the separation distance is in a range of 30-150 mm in the operating position.

8. The method of claim 1 further comprising controlling pressure in the chamber with a vacuum pump and an inert gas source.

9. The method of claim 1 further comprising controlling electrode operation with a computer having a memory, the memory storing operating parameters of the system, the operating parameters including a separation velocity.

10. The method of claim 1 further comprising generating a plurality of toroids around the arc formed across the separation distance.

11. The method of claim 1 further comprising accelerating an electron toroid to move the electron toroid towards a target.

12. The method of claim 1, wherein moving the toroidally shaped ion flow further comprises actuating a magnet coil assembly to move the toroidally shaped ion flow.

13. The method of claim 10 further comprising modulating the electric arc voltage to generate the plurality of toroids.

14. The method of claim 1 further comprising decreasing the operating voltage as the separation distance increases.

15. The method of claim 1 further comprising adjusting the electric voltage with a voltage control device.

16. A method for generating a toroidal flow of ions around an electric arc comprising:
    regulating gas pressure within a chamber;
    applying a controlled electric voltage across a gap separation distance between a first electrode and a second electrode to generate an electric arc that extends along an arc path;
    adjusting the electric voltage across the gap separation distance with a controller to generate a toroidally shaped ion flow around the electric arc; and
    modulating the gap separation distance between the first electrode and the second electrode and further adjusting the electric voltage across the gap separation distance in response to control signals from the controller to control the ion density of the toroidally shaped ion flow.

17. The method of claim 16 further comprising actuating relative movement between the first electrode and the second electrode with an actuator in response to operating parameters stored in a computer connected to the controller.

18. The method of claim 17 further comprising actuating said relative movement with a motor connected to the controller.

19. The method of claim 16 further comprising moving at least one of the first electrode and second electrode from an arc ignition position to an operating position.

20. The method of claim 16 further comprising increasing electric voltage across the arc path from an initial arc voltage to an operating arc voltage.

* * * * *